United States Patent [19]

de Jonge et al.

[11] 4,061,908

[45] Dec. 6, 1977

[54] METHOD OF AND DEVICE FOR TESTING A DIGITAL MEMORY

[75] Inventors: Jan Hendrik de Jonge, Beekbergen; Adrianus Josephus Smulders, Hoogland, both of Netherlands

[73] Assignee: U.S. Philips Corporation, New York, N.Y.

[21] Appl. No.: 643,622

[22] Filed: Dec. 23, 1975

[30] Foreign Application Priority Data

Dec. 23, 1974 Netherlands .......................... 7416755

[51] Int. Cl.² .......................... G11C 29/00; H03K 5/18
[52] U.S. Cl. .............................. 235/302.3; 235/304.1; 235/312; 365/201
[58] Field of Search ................. 235/153 AC, 153 AM; 340/174 ED

[56] References Cited

U.S. PATENT DOCUMENTS 3,869,603   3/1975   Auspurg et al. ............. 235/153 AM

OTHER PUBLICATIONS

Sitler, W. R., *Storage Intermittent Test,* In IBM Tech. Disc. Bull., 16(2); pp. 542-543, July, 1973.

*Primary Examiner*—R. Stephen Dildine, Jr.
*Attorney, Agent, or Firm*—Frank R. Trifari; Daniel R. McGlynn

[57] ABSTRACT

The invention provides a compact test sequence for testing integrated memories. First, all storage positions are filled with the bit "0". Subsequently, in a given order of the addresses, the "0" bit written for each address is read; immmediately thereafter a "1" bit is written in those bit positions. The positions are again tested by reading the "1" bits. When the last address of the predetermined order is reached, the "1" is read in the same order for each address. Subsequently a "0" is written, which is finally tested by reading again. When the last address is reached, all addresses are read in the reverse order, and a "1" is written, which is tested again. When the first address is reached, all addresses are read, filled with a "0" and tested. This process may be repeated as many times as there are bits in the address. The significance of the address bits are modified to form the predetermined order, for example, by cyclic rotation. For example, in the first cycle the order may be the normal order of successive addresses, while in the second cycle first all "even" and then all "odd" addresses are treated.

11 Claims, 10 Drawing Figures

|    | A A       | A B       | A C       | A D       | R W R   | R W R   |
|----|-----------|-----------|-----------|-----------|---------|---------|
| 1  | 0 0 0 0   | 0 0 0 0   | 0 0 0 0   | 0 0 0 0   | 0 1 1   | 1 0 0   |
| 2  | 0 0 0 1   | 0 0 1 0   | 0 1 0 0   | 1 0 0 0   | 0 1 1   | 1 0 0   |
| 3  | 0 0 1 0   | 0 1 0 0   | 1 0 0 0   | 0 0 0 1   | 0 1 1   | 1 0 0   |
| 4  | 0 0 1 1   | 0 1 1 0   | 1 1 0 0   | 1 0 0 1   | 0 1 1   | 1 0 0   |
| 5  | 0 1 0 0   | 1 0 0 0   | 0 0 0 1   | 0 0 1 0   | 0 1 1   | 1 0 0   |
| 6  | 0 1 0 1   | 1 0 1 0   | 0 1 0 1   | 1 0 1 0   | 0 1 1   | 1 0 0   |
| 7  | 0 1 1 0   | 1 1 0 0   | 1 0 0 1   | 0 0 1 1   | 0 1 1   | 1 0 0   |
| 8  | 0 1 1 1   | 1 1 1 0   | 1 1 0 1   | 1 0 1 1   | 0 1 1   | 1 0 0   |
| 9  | 1 0 0 0   | 0 0 0 1   | 0 0 1 0   | 0 1 0 0   | 0 1 1   | 1 0 0   |
| 10 | 1 0 0 1   | 0 0 1 1   | 0 1 1 0   | 1 1 0 0   | 0 1 1   | 1 0 0   |
| 11 | 1 0 1 0   | 0 1 0 1   | 1 0 1 0   | 0 1 0 1   | 0 1 1   | 1 0 0   |
| 12 | 1 0 1 1   | 0 1 1 1   | 1 1 1 0   | 1 1 0 1   | 0 1 1   | 1 0 0   |
| 13 | 1 1 0 0   | 1 0 0 1   | 0 0 1 1   | 0 1 1 0   | 0 1 1   | 1 0 0   |
| 14 | 1 1 0 1   | 1 0 1 1   | 0 1 1 1   | 1 1 1 0   | 0 1 1   | 1 0 0   |
| 15 | 1 1 1 0   | 1 1 0 1   | 1 0 1 1   | 0 1 1 1   | 0 1 1   | 1 0 0   |
| 16 | 1 1 1 1   | 1 1 1 1   | 1 1 1 1   | 1 1 1 1   | 0 1 1   | 1 0 0   |
| 17 | 1 1 1 1   | 1 1 1 1   | 1 1 1 1   | 1 1 1 1   | 1 0 0   | 0 1 1   |
| 18 | 1 1 1 0   | 1 1 0 1   | 1 0 1 1   | 0 1 1 1   | 1 0 0   | 0 1 1   |
| 19 | 1 1 0 1   | 1 0 1 1   | 0 1 1 1   | 1 1 1 0   | 1 0 0   | 0 1 1   |
| 20 | 1 1 0 0   | 1 0 0 1   | 0 0 1 1   | 0 1 1 0   | 1 0 0   | 0 1 1   |
| 21 | 1 0 1 1   | 0 1 1 1   | 1 1 1 0   | 1 1 0 1   | 1 0 0   | 0 1 1   |
| 22 | 1 0 1 0   | 0 1 0 1   | 1 0 1 0   | 0 1 0 1   | 1 0 0   | 0 1 1   |
| 23 | 1 0 0 1   | 0 0 1 1   | 0 1 1 0   | 1 1 0 0   | 1 0 0   | 0 1 1   |
| 24 | 1 0 0 0   | 0 0 0 1   | 0 0 1 0   | 0 1 0 0   | 1 0 0   | 0 1 1   |
| 25 | 0 1 1 1   | 1 1 1 0   | 1 1 0 1   | 1 0 1 1   | 1 0 0   | 0 1 1   |
| 26 | 0 1 1 0   | 1 1 0 0   | 1 0 0 1   | 0 0 1 1   | 1 0 0   | 0 1 1   |
| 27 | 0 1 0 1   | 1 0 1 0   | 0 1 0 1   | 1 0 1 0   | 1 0 0   | 0 1 1   |
| 28 | 0 1 0 0   | 1 0 0 0   | 0 0 0 1   | 0 0 1 0   | 1 0 0   | 0 1 1   |
| 29 | 0 0 1 1   | 0 1 1 0   | 1 1 0 0   | 1 0 0 1   | 1 0 0   | 0 1 1   |
| 30 | 0 0 1 0   | 0 1 0 0   | 1 0 0 0   | 0 0 0 1   | 1 0 0   | 0 1 1   |
| 31 | 0 0 0 1   | 0 0 1 0   | 0 1 0 0   | 1 0 0 0   | 1 0 0   | 0 1 1   |
| 32 | 0 0 0 0   | 0 0 0 0   | 0 0 0 0   | 0 0 0 0   | 1 0 0   | 0 1 1   |

METHOD OF AND DEVICE FOR TESTING A DIGITAL MEMORY

The invention relates to a method of testing memories, comprising a first number of discrete storage positions for binary information which can each be addressed at random by a specific address, the first number being at least substantially equal to $2^N$ and the addresses containing N binary information elements of successive significance in accordance with a first order. The storage positions are first filled with first information, after which the storage positions are read during a first cycle in accordance with a first address sequence. Since for the purpose of testing, the address is each time changed by one unit, after the read cycle the addressed storage positions are filled with changed information with respect to the read-out. The storage positions are then subsequently read again for the purpose of testing in accordance with the reverse of the first address sequence, and are filled again with changed information with respect to the latter read-out.

A method of this kind is known as a "marching ones and zeroes" method and is described in an article by E. Denis Colbourne et al., Reliability of MOS LSI chips, Proc. IEEE, Vol. 62 (February 1974), pages 244 – 259, notably pages 252/3. Fast testing methods are required because the capacity of memories increases quickly. There are two important categories of tests: functional tests and dynamic tests. The functional test examines the possibility that a stored information element (bit) is liable to be modified so that information is read or written in a different storage position. The dynamic tests measure the most unfavorable values of the access time for the memory; this access time may be dependent of the sequence wherein the storage positions are addressed, i.e. dependent of which address jump is performed. For example, by variation of the clock pulse frequency, the maximum permissible clock pulse frequency and thus implicitly the said most unfavorable values can then be measured.

In both cases the contents of the stored information can also be co-decisive. In accordance with the known state of the art, the information "0" is first written at all addresses. Subsequently, all storage positions are sequentially read, for example, starting with the first address, and a "1" is written thereat. After that, as from the last address, all storage positions are sequentially read again and a "0" is written, again. Subsequently, the process is repeated with the reverse information value. In this manner $10.2^N$ read and write operations are required so $10^4$ for a 1K cell and $4 \times 10^4$ for a 4K cell. In accordance with the article, the known technique is not very well suitable for testing for errors concerning multiple selection, DC pattern, access time, and recovery time after writing. Multiple selection occurs if a plurality of storage positions are selected by an address. If all addresses are used, it will be possible for some storage positions to be addressed in more than one manner, so that errors can occur. The DC pattern relates to unchangeable stored information. If other information is to be stored, an errors occurs. The access time is measured by performing the address jumps, but in accordance with the known technique only jumps to and from the storage position having the next-higher or next-lower address are performed. It will be obvious that in this manner many "difficult" jumps can be absent in the test pattern. The recovery time after writing indicates whether the disturbances caused by the writing have already decayed sufficiently, so that undisturbed reading of the written information can be effected. If this time is too long, the storage cycle is inadmissibily prolonged.

The present invention, provides an improved method of testing digital memories. The invention provides ways of performing these tests within a given, limited period of time. The invention provides a method whereby dynamic tests can be properly executed. To this end, in accordance with the invention the relative significance of the address bits is changed. The invention detects one-sided stuck-at address elements. The invention detects one-sided and two-sided coupling between address bits. The invention detects whether address bits are inactive in a single state of value. The invention detects storage elements with one-sided stuck-at information. The invention detects one-sided or two-sided coupling between different storage elements. The invention detects one-sided or two-sided coupling between rows and/or columns in the storage matrix. The invention detects errors which are inherent of specific patterns of the stored information elements. The invention tests the dynamic behavior, because different storaged information is always present when a change-over is made from one address to another. The invention detects four kinds of access times, because counting up as well as counting down takes place as regards the address and as regards two kinds of stored information at successive addresses. The invention tests each address bit for all states of the other address bits. This and ohter objects according to the invention are achieved in that the invention is characterized in that for a single storage element to be tested, the said sequence of reading/writing/reading/writing is repeated for one binary information element per storage position after the said first cycle during a second cycle, the storage positions being assigned a different sequence in that the order of significance of the N binary information elements is modified and in that during the said cycles, after each write operation, the information written is immediately read and without address modification for the purpose of testing. The invention is not restricted to memories with one information bit per address.

The order of significance of the N binary information elements is preferably cyclically rotated. A modification of the significance thus preformed can be readily controlled.

The second cycle is preferably subsequently repeated N-2 times, in each of the N cycles thus performed another one of the said N binary information elements being assigned the lowest significance. Testing is thus very complete, in that all address bits successively start the function in the same manner.

In the case of a plurality of storage elements per storage position to be tested, it is advantageous to repeat each read/write/read sequence to be performed without address modification for one binary information element per storage position within a cycle as many times for each address as the storage elements comprise storage positions, each time a different storage element thus being tested. In this manner a test is also performed as regards any "difficult information patterns" in the case of "words" which can be addressed in one operation.

It is advantageous if the storage elements of the same rank within the storage position are successively subjected to the said read/write/read sequence with exclusion of storage elements of a different rank in the said storage positions. The number of address jumps is thus increased with different information patterns.

It is advantageous if all the discrete storage positions are filled with the same information prior to the said first cycle. This offers a very thorough testing method which on the one hand requires a larger number of tests than the known technique, i.e. (12 N + 1). $2^N$ read or write operations, but for a 1K memory cell this amounts to 120,000 and for a 4K memory cell to approximately $6 \times 10^5$. If each operation requires 250 $nS$, in total 30 and 150 $mS$, respectively, will be required. This is very acceptable in comparison with the time required for displacements in automated machines. For positioning a storage circuit at the measuring location, 0.1 second will reasonably be required, so that the test period is comparatively short. On the other hand, many different properties of the memory are tested, as will be described hereinafter, so that the test method can be used for critically designated memories and for a multitude of possible imperfections.

The literature also describes further test methods which offer better results than the previously said state of the art (i.e. the marching ones and zeroes). However, the first example of the improved method, i.e. "walking ones and zeroes", offers substantial improvement only in the field of "dc-pattern", but the time required is much longer because $2N^2$ operations are necessary. For a 1K cell this amounts to $2.10^6$, and for a 4K cell to $32.10^6$. If each operation requires 250 $nS$ again, the entire test will require 0.5 seconds and 8 seconds, respectively. Even though the first value may be acceptable, the second value represents a substantial delay. Therefore, this method will certainly not be used for 100% tests of highcapacity memories. The said literature also describes test methods wherein essential progress is achieved with respect to the said state of the art. However, such sequences ("galloping ones and zeroes") require at least four times as much time as the method with "walking ones and zeroes", and in their most extensive form they even require ten times as much time (i.e. when both categories "galloping" are successively performed). Therefore, the aim will be to avoid such long test sequences (double "galloping" in the case of a 4K memory cell with a memory cycle of 250 $nS$ requires no less than 80 seconds). In that case the test method in accordance with the invention offers a comparatively high testing capacity at a comparatively short duration of the test. A cycle each time preferably comprises four subcycles, in each of which the storage elements to be tested are read in accordance with an address sequence then prevailing, or the opposite thereof, respectively, and are filled with information which is modified with respect to the read-out. This offers a simple organization of the cycles.

The invention furthermore relates to a device for testing digital memories in accordance with the foregoing, an address counter being provided which, under the control of a last position of a just completed counting cycle, subsequently supplies exclusively inverted address signals during a predetermined number of cycles, a clock pulse generator being provided which, under the control of a significance determining unit, controls a single binary counting position of the address counter as being the least significant. This result in a comparatively uncomplicated device.

The invention will be described in detail hereinafter with reference to a number of Figures.

Figure 1:
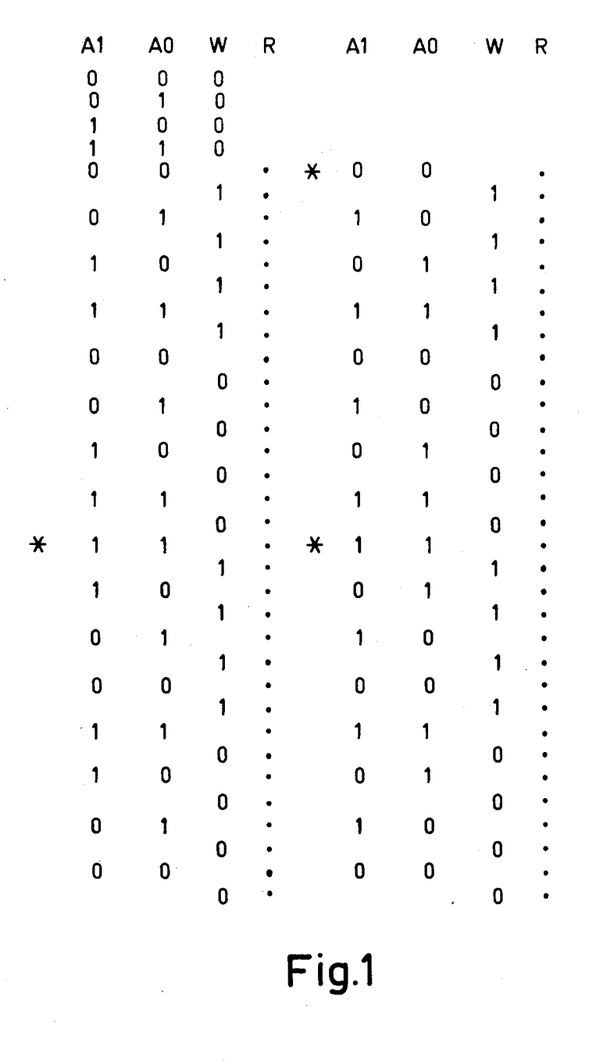
FIG. 1 shows a complete test cycle of a memory comprising four addresses.

FIG. 1 shows a complete test sequence for a memory comprising four addresses (memory not shown). The address thus contains two binary information elements A1, A0, the former thereof being the most significant in normal circumstances. Write operations (W) and read operations (R) can be performed in the memory. The information to be written can be "0" or "1", as is indicated in the column W. It is assumed that each address indicates only a single binary information element. First, a binary "0" is successively written at all addresses. After that, is "0" is read at the address "0 0", which is indicated by a dot. Subsequently, a "1" is written at that same address . . ., after which this "1" is read again for the purpose of testing (dot). The same is successively effected for the addresses 0 1, 1 0, 1 1. The process is subsequently repeated for the opposite information, but in the same sequence. Subsequently, each time a "0" is read, written over by a "1", and this "1" is tested, but in accordance with the reverse sequence 1 1, 1 0, 0 1, 0 0. This process is repeated again for the opposite information, the first column then being completed.

The significance of the binary address elements A1, A0 is exactly reversed in the second column. The information is thus read again ("0"), is erased by a "1", and is read again for testing. However, this is now effected first for the "even" addresses 0 0, 1 0 and subsequently for the "odd" addresses 0 1, 1 1. The entire process of the first column is then repeated with this modified sequence by changing the significance: "forward" filling with information "1", "forward" filling with information "0", "return" filling with information "1", "return" filling with information "0".

"Return" means that first the "odd" addresses are treated as from the highest address (1 1, 0 1), and subsequently the "even" addresses as of the highest address (1 0, 0 0). The test cycle thus comprises 100 write and read operations. The lines denoted by an asterisk can possibly be omitted. In given cases it is advantageous to choose a different sequence for the sub-sequences; a sub-sequence is then defined as a cycle in accordance with the Figure wherein all addresses are treated and which therefore comprises 12 read and write operations. Example: forward traject, information becomes "1"; return traject, information becomes "0"; forward traject with modified significance, information becomes "1"; return traject ditto, information becomes "0"; return traject normal significance, information becomes "0"; forward traject ditto, information becomes "0"; return traject with modified significance, information becomes "1"; forward traject ditto, information becomes "0". Furthermore, in this very simple configuration a number of address jumps occurs twice; this is caused by the small number of address bits. Generally, a number of address jumps are superfluous, and without these jumps all transitions could still be performed. However, these address jumps are distributed very irregularly, so that it is much easier to implement the described test sequence.

Figure 2:
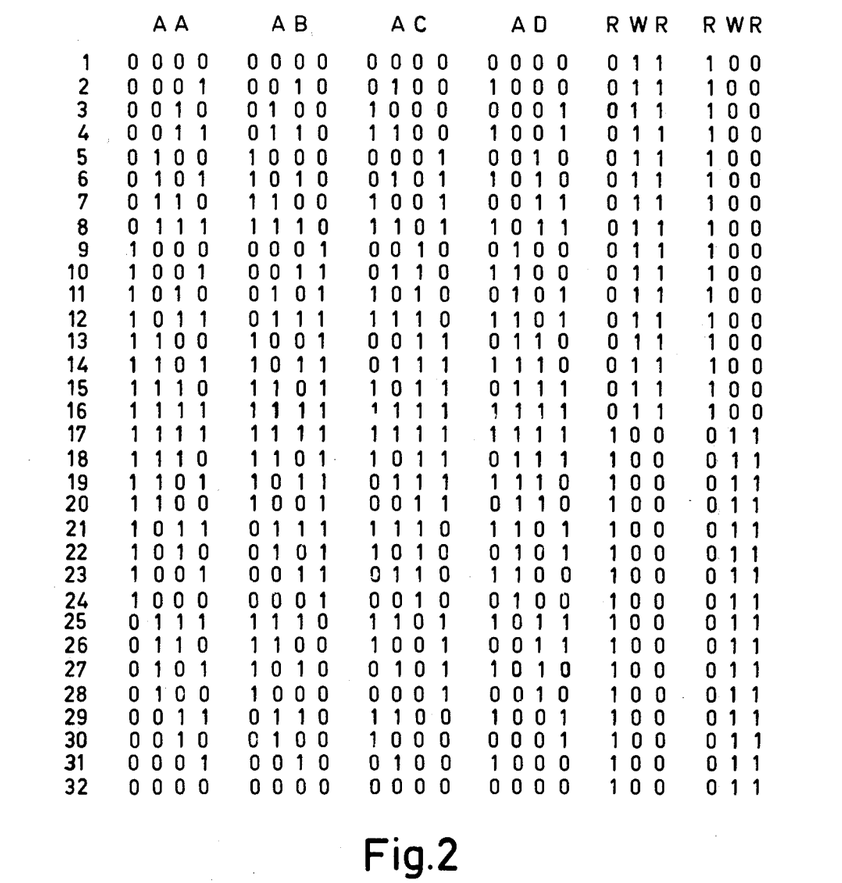
FIG. 2 shows the same for a memory comprising sixteen addresses in accordance with a very compact notation.

FIG. 2 shows a very compact notation of the test sequence in the case of 16 addresses. The column AA gives the normal sequence forward and return. The information thereof thus successively becomes (after the initial writing of the information "0" at all addresses) "1" (read 0, write 1, read 1) and in the same sequence the information then becomes "0". This is repeated in the reversed sequence. The column AB gives the sequence (forward and return) which occurs when the significance of the address bits is shifted over one position: the sequence "forward" is then first the "even" addresses 0 0 0 0, 0 0 1 0 . . . 1 1 1 0, and then the odd addresses 0 0 0 1 . . . 1 1 1 1 from the lowest to the highest order. The reverse sequence is accordingly. The same 12 operations per address column are again associated with this column. This column AC shows the sequence of the addresses if the significance of the address bits is shifted over one further position. In decimal notation the address sequence during the forward traject is then: 0, 4, 8, 12, 1, 5, 9, 13, 2, 6 . . . The operation of the first and the second column are then repeated. The column AD gives the sequence if the significance of the address elements is shifted over three positions. In decimal notation the address sequence during the forward traject is then: 0, 8, 1, 9, 2, 10, 3, 11, 4, 12, 5, 13, . . . The operations of the first three columns are then repeated; at the end, the test sequence has been completed. The total sequence requires 16 + 16 × 16 × 3 = 784 operations, which is about 8 times as much as for a four-address memory. The factor 8 is due to a number of addresses which is four times as large and the number of address bits which is twice as large.

In the foregoing the significance of the address bits was each time cyclically rotated, i.e. in accordance with the diagram; 1 2 3 4 — 2 3 4 1 — 3 4 1 2 — 4 1 2 3. Another feasible method would be in accordance with the diagram: 1 2 3 4 — 2 1 4 3 — 3 4 1 2 — 4 3 2 1.

In order to enable the quality of the test sequence to be determined, the feasible errors in the memory can be considered.

a. Selection errors in that an address bit is one-sided stuck-at or is not operational in one of the two values.

b. A one-sided or two-sided coupling exists between the address bits, with the result that during the selection of an address another address is also selected, but during the selection of the said other address the former address is it not selected or selected, respectively.

c. Storage information errors, for example, a storage bit contains one-sided stuck-at information.

d. A one-sided coupling exists between various storage elements: it may be that during the writing of a "1" in the first storage element, the second storage element is also filled with a "1", while in the reverse direction this can or cannot be the case; in the latter case the coupling is one-sided. The presence or absence of the coupling may also be dependent of the information, in that, for example, the information "1" prevails, but the information "0" does not prevail.

e. A one-sided or two-sided coupling exists between two rows, between two columns, or between a row and a column. The cause thereof may be the fact that two single conductors of a multiple bus line are interconnected. Generally, a two-sided coupling is caused by a direct interconnection, and a one-sided coupling by an interconnection via a diode.

Such errors are always detected by the test sequence in accordance with the invention. During the successive addressing of all storage addresses, always a state occurs where non-correspondence exists between a given arbitrary pair of information bits (storage bits or address bits). In the case of a one-sided coupling, this will also be detected, because the addresses are also addressed in the reverse sequence, and moreover, after each write operation the written information is immediately tested by reading.

In some cases a given stored information influences the dynamic or even the static behaviour of a given bit. Substantial attention is paid to this aspect in the test sequence in accordance with the invention. In a maxtrix-organized memory for each column in a predetermined situation of the test sequence a single "one" occurs among exclusively zeroes. The same is applicable to a single zero amidst exclusively ones. Furthermore, due to the cyclic rotation of the significance of the address bits, a single "one" occurs amongst exclusively zeroes in each row (and vice versa) in a given situation of the test sequence. A bit-wise distinction exists between two successive rows of storage elements of the maxtrix memory for all bits in a given situation of the test sequence. The same is again applicable as regards the columns of storage elements of the matrix memory.

The most important dynamic property of a memory is the address access time. In accordance with the invention, a change-over between successive addresses of the test sequence always produces an address access time, because the information after writing in an address always differs from the information still present in the next address, that is to say if no error occurs. Moreover, between each two successive addresses of the test sequence the access time is determined in four ways, i.e. in both directions and again for both values of the information.

In a given storage cell the address access time is determined by the delay time of all address bits in the decoding device. Therefore, each address bit must be tested with all possible combinations for the values of the other address bits; this is realized by the cyclic rotation of the significance of the address bits, while for each new significance sequence all addresses are addressed. The number of tests could actually be reduced by 50%, but this would result in a less regular test sequence. Further important dynamic characteristics of a memory are determined by the coincidence of signals during a correct period. Quantities of this kind are, for example, the synchronization between the starting and the presence of the different address signals, the same with reference to the information signals (set-up and hold times, respectively), and the pulse-width of the write enable pulse. The test sequence in accordance with the invention is very suitable for testing such quantities, because a comparatively large number of write operations are performed. Notably the said set-up times can be very well tested, because there are present just before and after a write operation signals which are inversed with respect to the signals tone written.

Furthermore, essentially non-justified elements in the output information can be tested for presence. These hazards or race conditions occur if due to differences in delay times of the various logic input signals of a system, brief output signals occur, which would be logically non-justified in the stationary situation and which would not occur in this situation. The occurrence of such phenomena can be tested by inverting the address while information stored in the inverted and the non-inverted address correspond. For the first half of the addresses which are treated during the successive addressing once of all addresses, this is the case before the stored information is erased by other information; for the second half of the addresses this is the case after the write operation. For testing address change-overs without information modification for access time, various possibilities exist:

a. part of the test sequence is executed with information elements being constantly equal to one or zero, respectively, b. instead of the above inversion of the address information elements, the test sequence moves back one step in the sub-sequence which contains all addresses of the memory exactly once.

Figure 3:
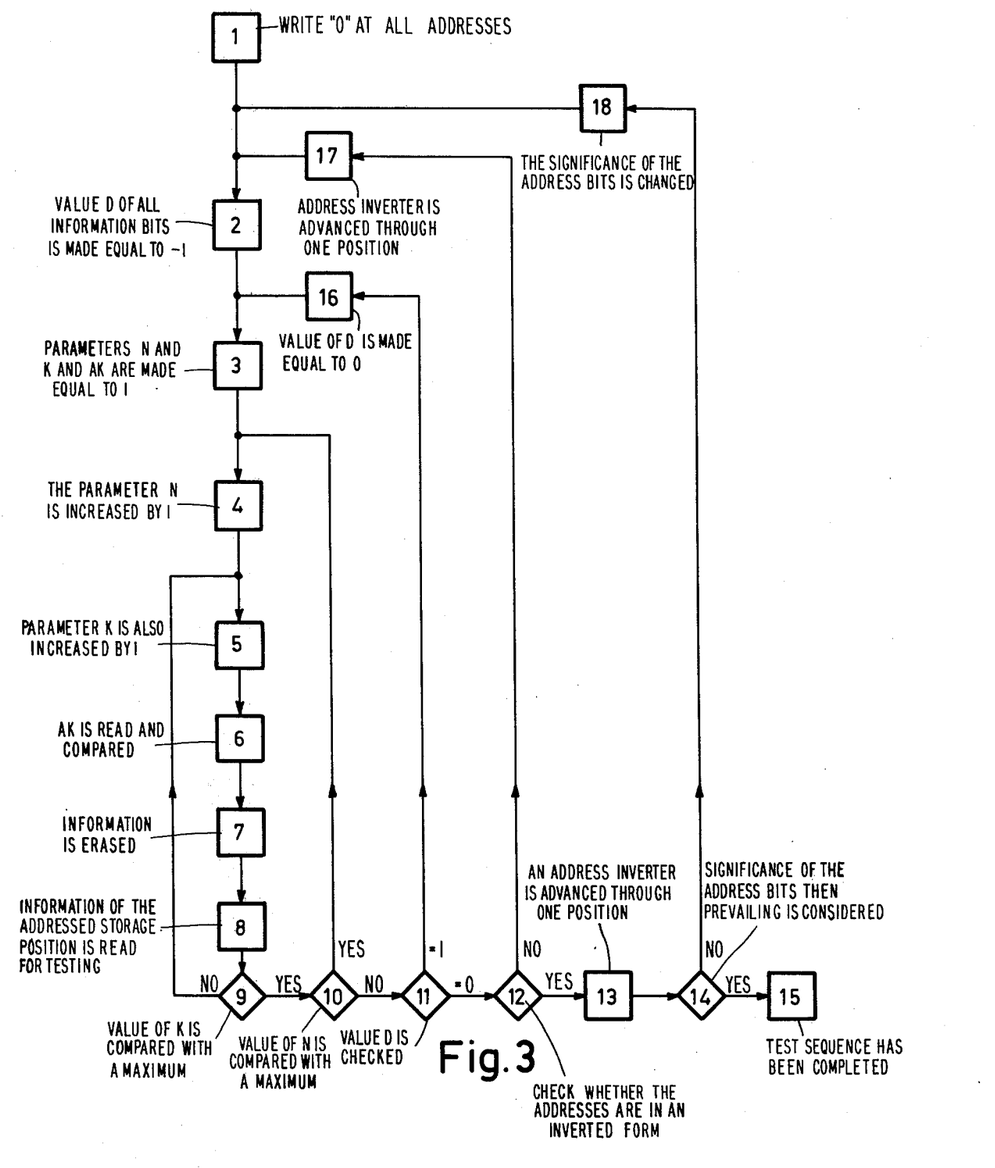
FIG. 3 shows a flow diagram of the method in accordance with the invention.

FIG. 3 shows a flow diagram in order to illustrate the operation of a device in accordance with the invention. In accordance with block 1, first the information "0" is written at all addresses. Subsequently, in accordance with block 2 the information value D of all information bits (possibly a plurality of bits per word) is made equal to 1. Subsequently, in accordance with block 3 the parameters $n$ and $k$ of the bit address information Bn (of a bit within a storage position, for example, a word position) and of the address information Ak (of the storage position), respectively, are made equal to $-1$ or the binary representation of the value $-1$. Consequently, no operational address is formed, but the logic structure of the flow diagram is simplified. After that, in accordance with block 4, first the parameter $n$ is increased by 1, in this case to zero. Subsequently, in accordance with block 5, the parameter $k$ is also increased by 1, so to zero in this case. After that, in accordance with block 6, the information of the storage position Ak is read and compared with the anticipated information, a given bit of the storage position being assigned by an additional pointer Bn. The value of all information bits as far as the bit assigned by the the pointer must be equal to the information value D; the assigned and further bits must have a value which differs from D (the inverse value). In the case of a single information bit per address, the value of $n$ is identical and equal to 0, and the pointer can be dispensed with. (If the information read does not comply with the said error, a storage error is involved and an error signalling is executed). In that case, in accordance with block 7, the information is erased by the new information, the only change being that the "assigned" bit position is filled with the value of D. Subsequently, in accordance with block 8, the information of the addressed storage position is immediately read for testing. Subsequently, in accordance with block 9, the value of $k$ is compared with a predetermined maximum value. In the case of non-correspondence, the test sequence proceeds to the described block 5. If correspondence is detected, the test sequence proceeds to block 10. The value of $k$ cannot be larger than the said maximum value. Subsequently, in accordance with block 10, the value of $n$ is compared with a predetermined maximum value. In the case of noncorrespondence, the test sequence proceeds to the already described block 4. If correspondence is detected, the test sequence proceeds to block 11. The value of $n$ cannot exceed the latter maximum value. Subsequently, in accordance with block 11, the value of D is checked. If the value is "1", the test sequence proceeds to block 16. Subsequently, in accordance with block 16, the value of D is made equal to 0. Subsequently, the test sequence proceeds to the described block 3. However, if the said value equals "0", the test sequence proceeds to the block 12. In accordance with the block 12, it is checked whether the addresses are supplied by the address generator in an inverted form. If this is not so, the test sequence proceeds to block 17. In accordance with the block 17, an address inverter is then advanced through one position, so that from then on the addresses are supplied in inverted form. Subsequently, the test sequence proceeds to the described block 2. If it has been found in the block 12 that the addresses were already supplied in inverted form, the test sequence proceeds to the block 13. In accordance with the block 13, subsequently an address inverter (the same as for block 17) is advanced through one position, so that the two-position inverter returns to its original position, with the result that the addresses are supplied in non-inverted form from then on. Subsequently, the test sequence proceeds to the block 14. In accordance with the block 14, the significance of the address bits then prevailing is considered. It may be that the significance rotates cyclically, while the number of shifted positions is updated by a counter. When this counter reaches a given position, for example, corresponding to the number of address bits, the test sequence proceeds to the block 15. It is then signalled that the test sequence has been completed. If an error had previously occurred in the test sequence already, the test sequence can be interrupted in an accelerated manner. If no error has been detected upon arrival in the block 15, the memory has passed the test. If the said counter had not yet reached the said given position upon arrival in the block 14, the test sequence proceeds to the block 18. In the block 18 the significance of the address bits is changed, for example, cyclically rotated through one position, the said counter then also being advanced through one position. Subsequently, the test sequence proceeds to the described block 2.

Figure 4:
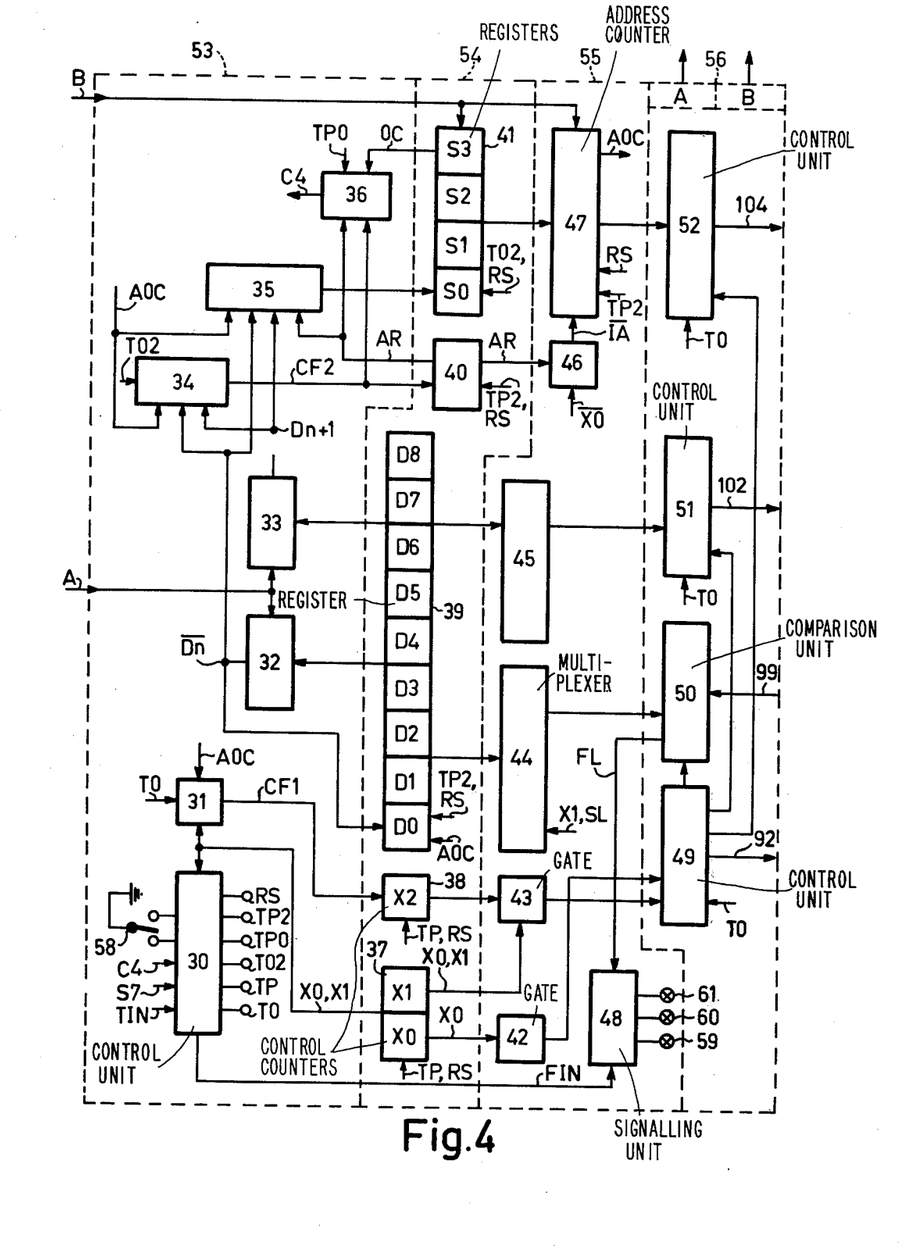
FIG. 4 shows a device in accordance with the invention.

FIG. 4 shows a device in accordance with the invention. The device comprises four serially connected sub-systems 53, 54, 55, 56. The sub-system 53 comprises the control elements. The element 30 is the central control unit which receives, via the line TIN, externally generated clock pulses of a clock (not shown). The line 57 can receive an additional signal, so that a memory continuously, or only once, completes a test sequence in accordance with the invention; for production applications a single cycle will usually be sufficient. For measuring the maximum use frequency, the diagram in accordance with FIG. 3 can be completed a plurality of times. It will then be possible to increase the clock frequency, for example, by a fixed value upon arrival (without error) in the block 15. There is also provided a device for determining the prevailing clock pulse frequency and hence ultimately the maximum permissible frequency. The element 30 furthermore receives a signal C4 and a signal from switch 58 whereby the element can be set to a starting position for starting a new test sequence. The central control unit supplies the following signals: TO, TP, TO2, TPO, TP2, RS, FIN. Generally, not all connections are denoted by lines, but by corresponding letters or letter combinations. The signals TO and TP are basic clock pulses, TP being generated comparatively shortly after TO in comparison with the return time of the two. The signal controls, for the purpose of synchronization, all signals which represent conditions for the programmable counters yet to be described. The further clock pulses TO2, TPO, TP2 are derived from the primary clock pulses TO, TP as is denoted by the name. When the test sequence in accordance with the invention is initiated, the unit 30 supplies a reset pulse RS for setting all registers to the desired starting position (elements 37, 38, 39, 40, 41 and 47). At the end of the test sequence, the signalling unit 48 receives a control signal via the line FIN. For example, the indicator 59 then indicates a defective storage cell, and the indicator 60 indicates a non-defective storage cell. The indicator 61 can light up to indicate a test (still) in progress. When an error occurs, the comparison unit 50 applies a signal FL to the signalling unit. The test sequence is terminated in that the unit 47 generates an output carry signal AOC which is applied to the units 31, 34, 35, 39, with the result that the effect of the clock pulses TO, TP ceases. A life test can be performed by blocking the signal AOC.

The sub-system 54 inter alia comprises the control counters 37, 38, comprising the information elements X0, X1, X2, which have the following significance for the control:

| X0 | X1 | X2 | significance | functional block Figure |
|----|----|----|---|---|
| 0 | 0 | 0 | none | — |
| 1 | 0 | 0 | measurement invalid | — |
| 0 | 1 | 0 | write "0" | |
| 1 | 1 | 0 | read "O" | |
| 0 | 0 | 1 | none | |
| 1 | 0 | 1 | read existing information | 6 |
| 0 | 1 | 1 | write new information | 7 |
| 1 | 1 | 1 | read said new information | 8 |

Figure 5:
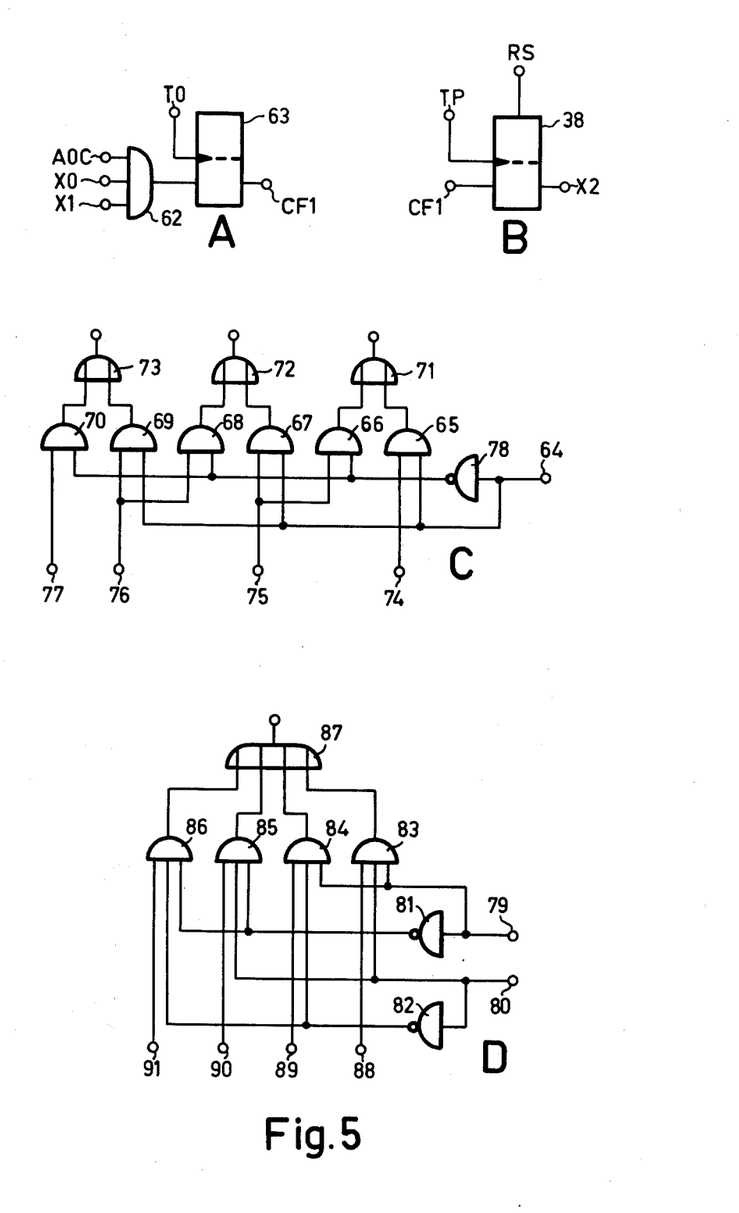
FIGS. 5A–5E show some details of FIG. 4.

When a "0" has been written at all addresses, the address counter 47 applies an output carry signal to the element 31, with the result that this element can be set, in accordance with the fourth line of the associated table, to the "1"-position under the control of a clock pulse TO (FIG. 5, circuit A, which comprises a logic AND-gate 62 and a D-flipflop 63 which is connected to the output thereof). Under the control of the clock pulse TP, the element 38 is then set to the "1"-position (see the D-flipflop shown at B in FIG. 5). The signal AOC also sets the bistable element DO of the counter 39 to the "1"-position. The elements DO to D7 of the unit 39 contain the information to be written in the storage cell. It is assumed that at the most 8 information bits can be stored in a given storage position ($k$ of FIG. 3), but this does not represent a restriction of the invention. The element 44 is a multiplexer which each time conducts eight out of nine information bits in a manner as shown at C' in the circuit of FIG. 5 for three out of four bits. When a logic "1"-signal is present on the control terminal 64, the AND-gates 65, 67, 69 are open, so that the signals on the terminals 74, 75, 76 appear on the outputs via the OR-gates 71, 72, 73, respectively. When a logic "0"-signal is present on the control terminal, however, the AND-gates 66, 68, 70 are open (due to the signal of the inverter 78), so that the signals on the terminals 75, 76, 77 appear on the relevant output terminals. If the signal X1 has the value "1", the information of the elements D0 . . . 7 is applied to the comparison device 50 (read-after-write); if X1 has the value "0", the information of the elements D1 . . . 8 (read-before-write) is applied to the comparison device 50. The element 37 comprises two flipflops wherein the control bits X0 and X1 are stored and which are connected as a three-position counter, so that the position (0, 0) does not occur. FIG. 5 shows a feasible circuit (at E), the holding elements being flipflops which take over the "1"-information on one of their inputs under the control of clock pulses on terminal 98. If X0 is in the position "1" and X1 is in the position "0", the AND-gate 97 supplies a logic "1", so that in reaction to the next clock pulse X0 assumes the position "0" and X1 assumes the position "1" (via the OR-gate 94). The AND-gate 95 then supplies a logic "1", so that in reaction to the next clock pulse X0 and X1 both assume the position "1". The AND-gate 96 then supplies a logic "1", so that in reaction to the next clock pulse X0 assumes the "1"-position and XI assumes the "0"-position again so that the initial situation is reached once more. The information of the flipflops X0, X1 is returned to the element 30 so as to generate secondary clock pulses therein. TP2 is then the rotation for a clock pulse which corresponds to TP but which is conducted (to the elements 39, 47) only if X0 as well as X1 contains the information "1". Consequently, the shift register 39 is shifted on in the presence of the signal AOC and TP2, with the result that the element D0 is filled with the information Dn (inverted value of Dn). In this case $n$ have the value 0, 1, 3, 7. This feedback can be effected by means of a multiplexer as shown in FIG. 5 at D. If two logic "1"-signals are present on the terminals 79, 80, the AND-gate 83 receives at least two "1"-signals and can thus conduct the signal on terminal 88 which appears on the output via OR-gate 87. If both terminals 79, 80 receive a logic "0", the AND-gate 86 becomes conducting via the inverters 81, 82. The control signals for the units 32 and 33 are derived in parallel from the output A of the sub-system 56 which operates as an adapter unit for the specific storage cell to be tested and which as such supplies specific information whereby the word length is indicated. Similarly, the multiplexer 33 applies the information of the next higher flipflop of the unit 39 to the units 34 and 35.

The element 42 acts as a gate which can activate the write enable unit 49 under the control of a logic 0 of element X0. The units 49 . . . 52 in the sub-system 56 are specifically adapted to the memory to be tested as regards the shape and the coherence in the time of the signals to be delivered and received. Under the control of a logic "1" of the element X0, the unit 49 does not supply a write enable pulse, but instead the element 43 then acts as a gate which receives the information X0, X1 and X2, so that a read enable pulse can be applied to the memory in the same manner as the write enable pulse. In the latter case the comparison unit 50 receives a strobe signal for the comparison between the data supplied by the multiplexer 44 and those originating, via the line 99, from the memory. This is still effected under the control of the clock pulse TO.

Figure 6:
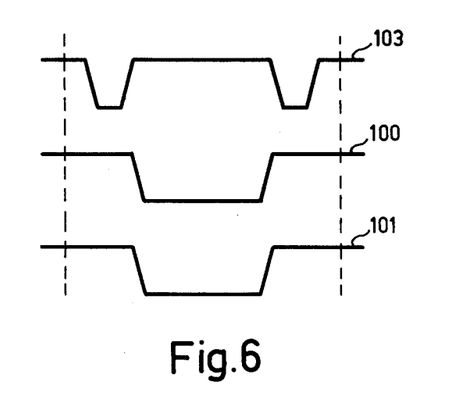
FIG. 6 shows a time-dependent signal for a memory cycle.

In order to make the dynamic qualities of the test sequence more complete, the unit 49 furthermore controls the units 51 and 52 by means of an inversion control signal as shown in FIG. 6. FIG. 6 shows, between the broken lines, a period for a memory write operation. The curve 101 denotes the write control; if this signal is low, information is written in the store. If this signal is high, a read operation can take place (outside the period for the write operation). The curve 100 symbolically denotes the information to be written as a single bit. Approximately simultaneously with the write enable, this signal becomes low in accordance with the information to be written. This information is otherwise present in inverted form on the output line 102 of the unit 51. The curve 103 denotes the output address information on the output line 104 of the output address register 52.

Briefly before and briefly after the write enable, this address information, again represented as a single bit, is briefly inverted. As a result, the already described set-up and hold times of the signals can be tested.

The address counter 47 can be a device for sixteen address bits whereby $2^{16}$ (64 k) storage positions can be addressed. In that case the element 41 comprises four active elements. Under the control of an appropriate signal on the input B, the units 47 and 41 can supply a full signal or the said signal AOC and the signal OC to the unit 36 for lower number of address elements already. For example, if there are only 14 active address bits, the unit 41 supplies the output signal OC after 14 positions have been passed through. Programmable counters of this kind are known per se. Under the control of the clock pulse TP2, the (binary) address counter 47 each time counts one position further, the address then prevailing being stored in the output address register 52 which is proportioned in accordance with the memory to be tested. Superfluous address bits of the counter 47 can, for example, be short-circuited as permanent "0". Under the control of the signal AO (and the signals $\overline{Dn}$ and $Dn+1$), the element 34 supplies a signal (synchronized by the clock pulse TO2). The element 34 is constructed as denoted by A in FIG. 5, and hence consists of an AND-gate having three inputs, followed by a data flipflop. The output signal of this flipflop is applied to the elements 36 and 40 via the lines denoted by CF2. The element 40 is a known JK-flipflop which subsequently applies the signal AR to the elements 35, 36 and 46. Due to the clock pulse TP2, the signal AR disappears again. The element 46 is a known logic exclusive - OR-gate, comprising inputs $\overline{X0}$ (inverted value of X0) and AR. If AR has the value "1" and X0 has the value "1", the output $\overline{IA}$ is also "1", with the result that the said inverting of the address has been implemented. Consequently, for the same significance distribution over the address bits, the storage positions can be addressed in two opposed sequences. It is to be noted that the inversion over a number of successive storage operations under the control of the signal $\overline{IA}$ can be continuously present, so that it does not at all relate to the inversion in the unit 52, which dynamically occurs within a single storage operation.

If the signal AR occurs and the signals $\overline{Dn}$ and $Dn+1$ are subsequently both logic "1" (the latter combination indicates an output carry of the shift register 39), the logic AND-gate 35 (four inputs) supplies a signal, under the control of the further signal AOC, to the programmable counter which is thus advanced one position. The resetting of this counter under the control of the external signal RS, which can also be generated by the switch 58, is effected by way of an AND-function of the signal RS and the signal TO2. The same is applicable whenever two signal indications have been indicated at a single input arrow. The flipflops S0 ... S3 of the programmable sequence are decoded to a one-out-of-16 code by a decoder not shown. Each of these one-out-of-16 code signals is related to a corresponding one of the 16 address bits of the address counter 47, so that the assigned bit receives the lowest significance. This can be realized by applying the clock pulse TP2 to 16 AND-gates in parallel, the other gate input of each of the said AND-gates having connected thereto one of the one-out-of-16 code lines. The outputs of these AND-gates, one of which is always conducting, are coupled to the counting input of the relevant counting stage via an OR-gate. The other gate inputs of the OR-gates are then each time connected to the carry outputs of the next-lower counting stages. The cyclic rotation of the significance sequence of the address bits in thus simply controlled by the position of the counter 41. When the counter has completed its cycle and, moreover, the signal CF2 and AR are present, the unit 36 supplies a signal C4 under the control of a clock pulse TP0. The unit 36 is constructed in the same manner as the units 31 and 34, and thus comprises an AND-gate having three inputs, followed by a data flipflop. The signal C4 is applied to the control unit 30 which then signals that a test sequence has been completed. The unit 50 can signal signal an error to the unit 48 via the line FL. The input A controls the number of information bits; the input B controls the number of address bits. The relevant information is stored in the sections AB of the sub-system 56 denoted by broken lines. The information B can control, moreover, the initial significance of the address bits with respect to each other.

The sub-system 53 comprises the general control; the sub-system 54 comprises the program counter; the sub-system 55 comprises the adaptation units, and the sub-system 56 comprises the units adapted to the specific memory to be tested. The invention is not restricted to the said specific number of information bits and address bits, while devices other than those shown in FIG. 4 are also covered thereby.

What is claimed is:

1. A method of testing memories, in which a predetermined first number of discrete, random addressable, storage positions for binary information is provided with each storage position having a specific address, said first number being at least substantially equal to $2^N$ and the addresses containing N binary information elements of successive significance in accordance with a first order, comprising the steps of filling the storage positions first with a first information, subsequently reading the storage positions during a first cycle in accordance with a first address sequence for the purpose of testing in that the address is each time changed by one unit, subsequently filling the addressed storage positions with changed information with respect to the read-out, reading the storage positions again for the purpose of testing in accordance with the reverse of the first address sequence, and filling again said storage positions with changed information with respect to the latter read-out, repeating said first cycle during a second cycle, the storage positions being assigned a different sequence in that the order of significance of the said N binary information element is modified.

2. A method as claimed in claim 1, further comprising the step, after each write operation, the information written is immediately read without address modification for the purpose of testing 3. A method as claimed in claim 1 wherein the order of significance of the said N binary information elements is cyclically rotated.

4. A method as claimed in claimed in claim 3, further comprising the step of repeating said second cycle N-2 times, in each of the N cycles thus executed another one of the said N binary information elements being assigned the lowest significance.

5. A method as claimed in claim 1 further comprisingt the step of repeating each read-write-read sequence to be executed without address modification within a cycle as many times for each address as there are storage elements in the storage positions, each time a different storage element thus being tested.

6. A method as claimed in claim 5, wherein each time the storage elements of the same order within the storage positions are successively subjected to the said read-write-read sequence, with the exclusion of storage elements of a different rank within the said storage positions.

7. A method as claimed in claim 1, wherein prior to said first cycle, all discrete storage positions are filled with the same information.

8. A method as claimed in claim 1, wherein each of said cycles comprises four subcycles, in each subcycle the storage elements to be tested are read in accordance with an address sequence then prevailing or in accordance with the opposite sequence inverse thereto thereof, respectively, the storage elements subsequently being filled with information modified with respect to the read-out.

9. A device for testing digital memories comprising a read enable device, a write enable device, and an information testing device, and an address counter which supplies, under the control of a last position of a just completed counting cycle, exclusively inverted address signals for a predetermined number of subsequent cycles.

10. A device as claimed in claim 9 further comprising a clock pulse generator, and a significance determining device, for selectively controlling a single binary counting position of said address counter as being the least significant position.

11. A device as claimed in claim 9 further comprising a dynamic output address inverter for supplying an inverted output address signal before and after a write enable signal during a predetermined time interval.

* * * * *